(12) United States Patent
Wu et al.

(10) Patent No.: US 9,698,160 B2
(45) Date of Patent: Jul. 4, 2017

(54) METHOD FOR TRANSFERRING MICRO DEVICES AND METHOD FOR MANUFACTURING DISPLAY PANEL

(71) Applicant: AU Optronics Corporation, Hsin-Chu (TW)

(72) Inventors: Tsung-Tien Wu, Hsin-Chu (TW); Kang-Hung Liu, Hsin-Chu (TW); Tsung-Yi Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/150,795

(22) Filed: May 10, 2016

(65) Prior Publication Data

US 2016/0336304 A1 Nov. 17, 2016

(30) Foreign Application Priority Data

May 15, 2015 (TW) .............................. 104115625 A (51) Int. Cl.
| | |
|---|---|
| H01L 25/16 | (2006.01) |
| H01L 27/12 | (2006.01) |
| H01L 21/683 | (2006.01) |
| H01L 33/00 | (2010.01) |
| H01L 25/075 | (2006.01) |

(52) U.S. Cl.
CPC ...... H01L 27/1214 (2013.01); H01L 21/6835 (2013.01); H01L 33/0095 (2013.01); *H01L 25/0753* (2013.01); *H01L 2221/68322* (2013.01); *H01L 2221/68354* (2013.01); *H01L 2221/68368* (2013.01); *H01L 2221/68381* (2013.01)

(58) Field of Classification Search
CPC ....... H01L 2924/00; H01L 2924/12041; H01L 21/6835; H01L 25/0753; H01L 2224/83; H01L 24/83; H01L 33/0079; H01L 25/50
See application file for complete search history.

(56) References Cited

U.S. PATENT DOCUMENTS

| | | | |
|---|---|---|---|
| 6,762,074 B1 * | 7/2004 | Draney | ................... H01L 24/29 257/E21.505 |
| 8,426,227 B1 * | 4/2013 | Bibl | ....................... H01L 33/04 438/25 |
| 8,552,436 B2 | 10/2013 | Bibl et al. | |
| 9,306,117 B2 * | 4/2016 | Wu | ..................... H01L 33/0095 |

(Continued)

FOREIGN PATENT DOCUMENTS

| | | |
|---|---|---|
| JP | 2003077940 | 3/2003 |
| TW | 531044 | 5/2003 |
| TW | I231615 | 4/2005 |

*Primary Examiner* — Jaehwan Oh
(74) *Attorney, Agent, or Firm* — WPAT, PC (57) ABSTRACT

A method for transferring micro devices is provided. The method includes the following operations: providing a carrier substrate and forming micro devices on the carrier substrate; forming a fixing layer on the carrier substrate, in which the fixing layer is at least in contact with bottom parts of the micro devices; patterning the fixing layer to selectively expose a portion of the micro devices; providing a transfer device correspondingly located on the carrier substrate, and picking up the exposed micro devices by the transfer device; and providing a receiving substrate and transferring the exposed micro devices to the receiving substrate.

19 Claims, 9 Drawing Sheets

(56) References Cited

U.S. PATENT DOCUMENTS

| | | | |
|---|---|---|---|
| 9,449,948 B2* | 9/2016 | Koyanagi | H01L 25/0657 |
| 2003/0087476 A1* | 5/2003 | Oohata | G09F 9/33 |
| | | | 438/108 |
| 2004/0072385 A1* | 4/2004 | Bauer | H01L 21/67132 |
| | | | 438/68 |
| 2004/0235267 A1* | 11/2004 | Sheats | H01L 21/67092 |
| | | | 438/455 |
| 2005/0233546 A1 | 10/2005 | Oohata et al. | |
| 2006/0013680 A1* | 1/2006 | Haba | B23K 26/0846 |
| | | | 414/800 |
| 2006/0108678 A1* | 5/2006 | Kumar | B23K 35/0222 |
| | | | 257/690 |
| 2008/0060750 A1* | 3/2008 | Wang | G06K 19/077 |
| | | | 156/238 |
| 2008/0122119 A1* | 5/2008 | Kian | H01L 21/6835 |
| | | | 257/783 |
| 2008/0124842 A1* | 5/2008 | Wang | G06K 19/07752 |
| | | | 438/118 |
| 2008/0194049 A1 | 8/2008 | Wuu et al. | |
| 2010/0051190 A1* | 3/2010 | Jerebic | H01L 21/67132 |
| | | | 156/248 |
| 2011/0151588 A1* | 6/2011 | Ashdown | H01L 21/6835 |
| | | | 438/3 |
| 2011/0287560 A1* | 11/2011 | Chew | B23K 1/0016 |
| | | | 438/15 |
| 2012/0314388 A1* | 12/2012 | Bower | H01L 21/563 |
| | | | 361/760 |
| 2013/0126081 A1* | 5/2013 | Hu | H01L 33/405 |
| | | | 156/249 |
| 2014/0084482 A1* | 3/2014 | Hu | H01L 24/06 |
| | | | 257/774 |
| 2014/0374144 A1* | 12/2014 | Burggraf | H01L 21/6835 |
| | | | 174/250 |
| 2015/0140785 A1* | 5/2015 | Kwak | H01L 21/78 |
| | | | 438/464 |
| 2015/0228622 A1* | 8/2015 | Koyanagi | H01L 23/49838 |
| | | | 257/777 |
| 2016/0144608 A1* | 5/2016 | Chang | B32B 37/12 |
| | | | 216/83 |

* cited by examiner

METHOD FOR TRANSFERRING MICRO DEVICES AND METHOD FOR MANUFACTURING DISPLAY PANEL

RELATED APPLICATIONS

This application claims priority to Taiwan Application Serial Number 104115625, filed May 15, 2015, which are herein incorporated by reference.

BACKGROUND

Technical Field of Disclosure

The present disclosure relates to a method for transferring micro devices and, and more particularly, to a method for transferring micro LEDs.

Related Art

In a micro light-emitting diode (LED) array, tiny micro LEDs (the size of each micro LED is smaller than 100 μm) are disposed in an array on the array substrate having a pixel circuit. By using a driver addressing technology, each of the micro LEDs can be controlled by address and turned on independently, such that each of the micro LEDs can function as a pixel. Therefore, the micro LED array can function as a display panel.

In addition to the features of high efficiency, high brightness, high reliability, and fast response time and so on, the micro LED array further has the advantages of energy saving, simple mechanism, smallness, thinness and so on. Compared to an organic LED display, which is also self-luminous, the micro LED array has a better material stability and longer lifetime, and the micro LED array does not have the problem of image sticking.

When the micro LED array are manufactured, the micro LEDs and the array substrate can be formed respectively, and then the micro LEDs and the array substrate are electrically connected to each other by using a packaging technology such as flip chip bonding. The micro LEDs can also be integrated with a microlens array to enhance brightness and contrast.

In order to further improve the characteristics of micro LEDs, everyone racking their brains to develop the relevant art. How to provide better characteristics of micro LEDs and the relevant manufacture, there is always a need in the related field to provide a novel micro LED array.

SUMMARY

This disclosure provides a method for transferring micro devices. By integrating different processes, the manufacturing cost is reduced, and the yield is improved.

In one aspect of the disclosure, a method for transferring micro devices is provided. The method includes the following steps: providing a carrier substrate and forming a plurality of micro devices on the carrier substrate; forming a fixing layer on the carrier substrate, in which the fixing layer is at least in contact with bottom parts of the micro devices; patterning the fixing layer to selectively expose at least one of the micro devices; providing a transfer device correspondingly located on the carrier substrate and picking up the exposed micro devices by the transfer device; and providing a receiving substrate and transferring the exposed micro devices to the receiving substrate.

In one or more specific embodiments, the fixing layer is formed from a photosensitive organic material including a photoresist material. The photoresist material includes positive photoresist or negative photoresist.

In one or more embodiments, the operation of picking up the exposed micro devices further includes picking up the exposed micro devices by providing a pick-up surface of the transfer device in contact with the exposed micro devices.

In one or more specific embodiments, the transfer device picks up the exposed micro devices by using a force at a distance, which means that at first the transfer device don't picks up the exposed micro devices in direct contacts.

In one or more specific embodiments, the pick-up surface of the transfer device has a metal layer connected to an external circuit, thereby generating an electrostatic force on the metal layer to pick up the exposed micro devices.

In one or more specific embodiments, the pick-up surface of the transfer device has a metal layer connected to an external circuit, thereby generating a magnetic force on the conductive magnetic layer to pick up the exposed micro devices.

In one or more specific embodiments, the pick-up surface of the transfer device has an elastic adhesive layer, and the transfer device picks up the exposed micro devices by using the elastic adhesive layer.

In one or more specific embodiments, when the micro devices are disposed on the carrier substrate, a first pitch exists between adjacent two of the micro devices, and a second pitch exists between adjacent two of the micro devices disposed on the receiving substrate after the transfer device transfers the exposed micro devices to the receiving substrate, wherein the second pitch is an integer multiple of the first pitch. The integer multiple is preferably to be greater than two.

In one or more specific embodiments, the method further includes the following steps: patterning the fixing layer again to selectively expose another portion of the plurality of micro devices; picking up the another portion of the plurality of micro devices by using the transfer device; transferring the another portion of the plurality of exposed micro device to another receiving substrate; and repeating the operation of patterning the fixing layer and the operation of transferring the exposed micro devices (the at least one of the plurality of micro devices) to other receiving substrates.

In one or more specific embodiments, the carrier substrate further includes a bonding layer and a body, the bonding layer temporarily fixes the micro devices on the body.

In one or more specific embodiments, the bonding layer is formed from organic polymer, metal, alloy, or less sticky tape.

In one or more specific embodiments, before the operation of picking up the exposed micro devices (the at least one of the plurality of micro devices) by the transfer device, the bonding layer is irradiated by ultraviolet light or laser, or the bonding layer is heated, thereby releasing the bonding layer from the body.

In one or more specific embodiments, the receiving substrate includes a connecting layer and an array substrate, and after the exposed micro devices (the at least one of the plurality of micro devices) are transferred, the connecting layer fixes the transferred micro devices on the array substrate. The material of the connecting layer includes metal in molten state, conductive adhesive, or adhesive glue.

In another aspect of the disclosure, a method for forming a display panel is provided. The method includes following steps: providing a first carrier substrate and forming a plurality of first micro devices on the first carrier substrate; forming and patterning a fixing layer on the first carrier substrate to selectively expose at least one of the plurality of first micro devices; picking up the exposed first micro devices by a transfer device and transferring and fixing the exposed first micro devices on the receiving substrate; providing a second carrier substrate and forming a plurality of second micro devices on the second carrier substrate; forming and patterning a fixing layer on the second carrier substrate to selectively expose a portion of the second micro devices; picking up the exposed second micro devices by the transfer device and transferring and fixing the exposed second micro devices on the receiving substrate; and forming a top electrode on the first micro devices and the second micro devices disposed on the receiving substrate to form a display panel.

In one or more specific embodiments, the plurality of first micro devices have a first pitch existing between adjacent two of the plurality of first micro devices on the first carrier substrate, and after the plurality of first micro devices are transferred to the receiving substrate, the plurality of first micro devices have a second pitch existing between adjacent two of the plurality of first micro devices on the receiving substrate, in which the second pitch is an integer multiple of the first pitch and the plurality of first micro devices emit light in the same color.

In one or more specific embodiments, the plurality of second micro devices have a first pitch existing between adjacent two of the plurality of second micro devices on the second carrier substrate, and after the plurality of second micro devices are transferred to the receiving substrate, the plurality of second micro devices have a second pitch existing between adjacent two of the plurality of second micro devices on the receiving substrate, in which the second pitch is an integer multiple of the first pitch and the plurality of second micro devices emit light in the same color.

In one or more specific embodiments, the receiving substrate includes a connecting layer and an array substrate, and after at least one of the plurality of first micro devices and at least one of the plurality of second micro devices are transferred to the receiving substrate, the connecting layer fixes the at least one of the plurality of first devices and the at least one of the plurality of second micro devices on the array substrate.

In one or more specific embodiments, the material of the connecting layer includes metal in molten state, conductive adhesive, or adhesive glue.

In the embodiments of the invention, the micro devices are transferred by first using the fixing layer to fix a portion of the micro devices, and then using the transfer device to pick up the exposed micro devices without needing new manufacturing facilities, thus reducing the manufacturing cost.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
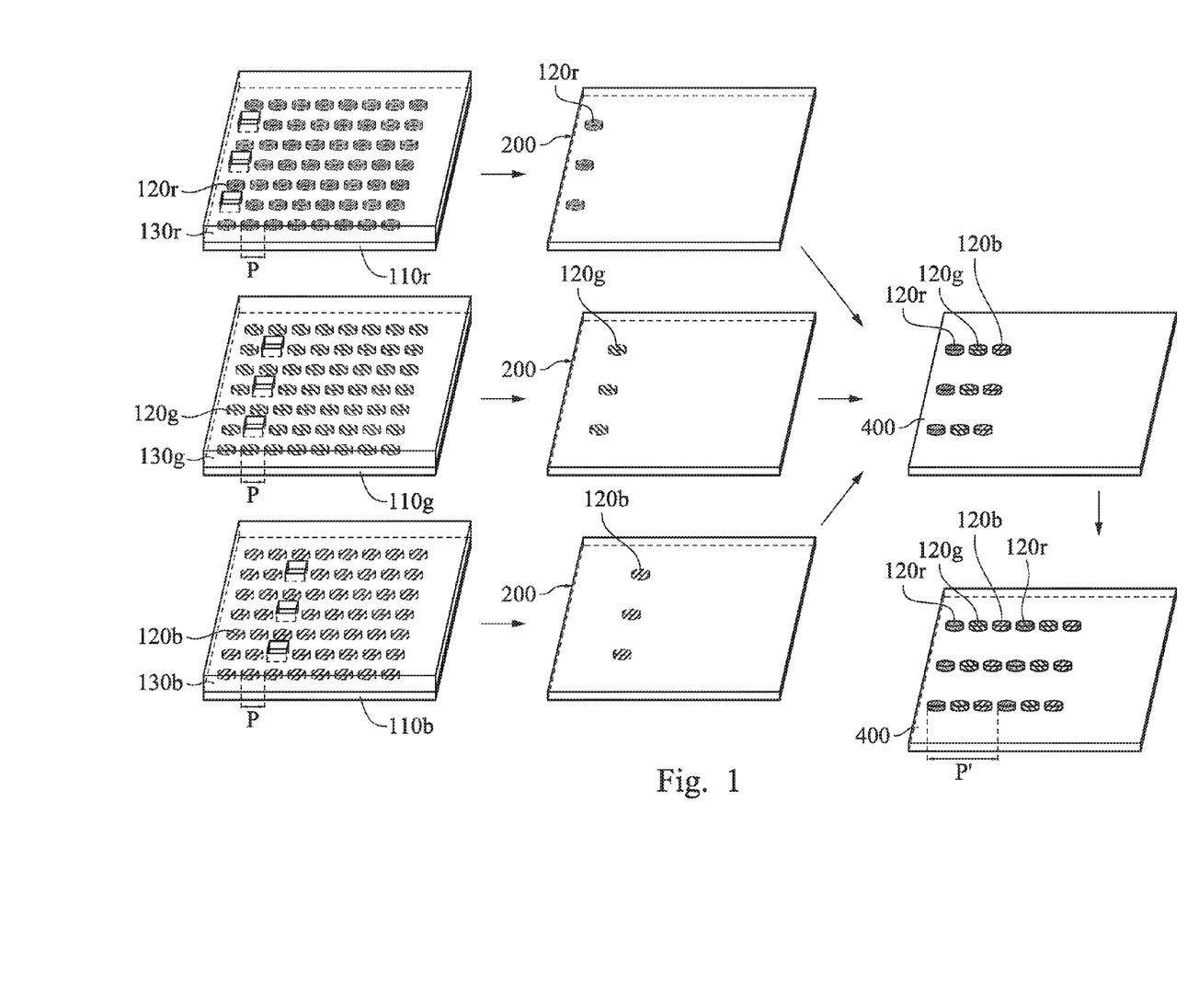
FIG. 1 illustrates respective perspective views of a first carrier substrate, a second carrier substrate, a third carrier substrate, a receiving substrate, micro devices thereon, and a transfer device according to one embodiment of this disclosure.

FIG. 1 illustrates respective perspective views of a first carrier substrate 110*r*, a second carrier substrate 110*g*, a third carrier substrate 110*b*, a receiving substrate 400, a first micro devices 120*r*, a second micro device 120*g*, and a third micro device 120*b* thereon, and transfer device 400 according to one embodiment of this disclosure. For example, the first micro devices 120*r* perform red micro LEDs, the second micro devices 120*g* perform green micro LEDs, and the third micro devices 120*b* perform blue micro LEDs, but not limited it's. As shown in FIG. 1, the first micro devices 120*r*, the second micro device 120*g*, and the third micro device 120*b* are respectively disposed on the first carrier substrate 110*r*, the second carrier substrate 110*g*, and the third carrier substrate 110*b*, and the micro devices 120*r*, 120*g*, and 120*b* may be micro light-emitting diodes (LEDs), such as micro-type LEDs. When a display panel including micro LEDs is manufactured, micro LEDs are transferred. In other words, the micro devices 120*r*, 120*g* and 120*b* respectively disposed on the first carrier substrate 110*r*, the second carrier substrate 110*g* and the third carrier substrate 110*b* are transferred to the receiving substrate 400 by the transfer device 200, so as to form the display panel. The micro devices 120*r*, 120*g*, and 120*b* may be but not limit to vertical structure of micro LEDs or horizontal structure of micro LEDs, in which the cathodes and the anodes of the vertical structure of micro LEDs are respectively located on upper and lower sides of the vertical micro LEDs. The cathodes and the anodes of the horizontal structure of micro LEDs are only located on one side of the horizontal structure of micro LEDs, the side of the horizontal structure of micro LEDs is opposite to other side of the horizontal structure of micro LEDs, and the other side facing the receiving substrate 400. Embodiments of this disclosure are not limited thereto.

For example, the micro devices 120*r* are red micro LEDs, the micro devices 120*g* are green micro LEDs, and the micro devices 120*b* are blue micro LEDs. Because the micro LEDs in the same group emitting the light in the same color, such as the micro devices 120*r*, 120*g*, and 120*b*, are respectively disposed on the first carrier substrate 110r, the second carrier substrate 110g, and the third carrier substrate 110b, the micro devices 120r, 120g, and 120b need to be transferred to the receiving substrate 400 in batches by the transfer device 200, so as to form the display panel. The micro devices 120r disposed on the first carrier substrate 110r are transferred to the receiving substrate 400 in batches by the transfer device 200, the micro devices 120g disposed on the second carrier substrate 110g are transferred to the receiving substrate 400 in batches by the transfer device 200, and the micro devices 120b disposed on the third carrier substrate 110b are transferred to the receiving substrate 400 in batches by the transfer device 200. Hence, the micro devices 120r, 120g, and 120b are disposed in an array on the receiving substrate 400. Embodiments of this disclosure are not limited thereto. People having ordinary skill in the art can make proper modifications to the sequence of transferring the micro devices 120r, 120g, and 120b depending on actual applications.

In another embodiment, the first carrier substrate 110r, the second carrier substrate 110g, and the third carrier substrate 110b may be the same carrier substrate. In other embodiments, the transfer devices 200 may be plural to enhance the transfer efficiency and reduce manufacturing time.

FIG. 2A to FIG. 2G are cross-sectional views of intermediate stages in a method for transferring micro devices 120 according to one embodiment of this disclosure. The micro devices 120 may be micro LEDs, and the size of each micro device 120 is substantially equal to or small than 100 micrometers (μm). In addition, the micro devices 120 can be corresponding to the aforementioned micro devices 120r, 120g, and 120b (for example, the red micro LEDs, the green micro LEDs or the blue LEDs). Embodiments of this disclosure are not limited thereto.

Figure 2A:
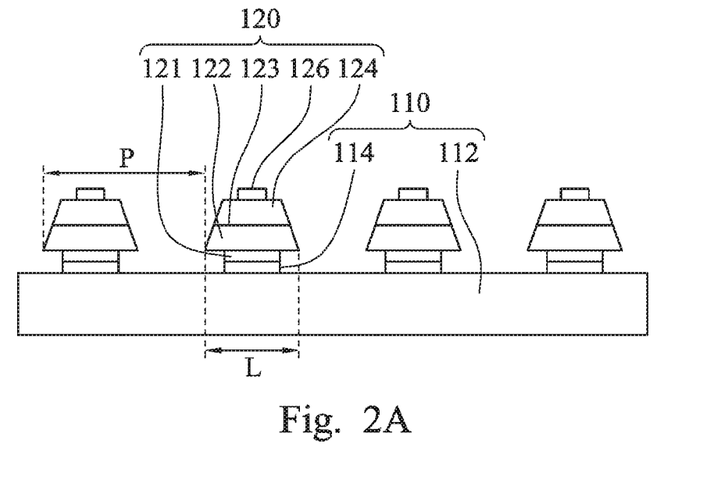
FIG. 2A to FIG. 2G are cross-sectional views of intermediate stages in a method for transferring micro devices according to one embodiment of this disclosure.

As shown in FIG. 2A, at first, a carrier substrate 110 is provided, and micro devices 120 are disposed on the carrier substrate 110. The carrier substrate 110 includes a bonding layer 114 and a body (or namely based) 112. The bonding layer 114 is disposed on the body 112, and the micro devices 120 are disposed on the bonding layer 114. The bonding layer 114 temporarily fixes the micro devices 120 on the body 112.

In the embodiment, the bonding layer 114 is patterned, and thus the bonding layer 114 is disposed below the micro devices 120. In other embodiments, the bonding layer 114 may not be patterned.

The micro devices 120 are disposed in an array on the carrier substrate 110, a pitch P exists between two adjacent micro devices 120, in which the pitch P is the distance between the edge of one micro device 120 and the corresponding edge of the adjacent micro device 120. In this embodiment, the micro devices 120 emit the same color light. Alternatively, the pitch P is the distance between the centers of the two adjacent micro devices.

Further, each of the micro devices 120 includes a first electrode 121 (or conductor layer), a first semiconductor layer 122, an active layer 123, and a second semiconductor layer 124 as an example. The first semiconductor layer 122 is disposed on the first electrode 121. The second semiconductor layer 124 is disposed on the first semiconductor layer 122. The active layer 123 is disposed between the first semiconductor layer 122 and the second semiconductor layer 124.

Each of the micro devices 120 may further include an auxiliary electrode 126 (or conductor layer). The auxiliary electrode 126 is disposed on the second semiconductor layer 124, and the auxiliary electrode 126 may be formed from transparent metal oxide such as at least one of indium tin oxide (ITO), indium zinc oxide (IZO), aluminum zinc oxide (AZO), aluminum indium oxide (AlO), indium oxide (InO), and gallium oxide (GaO), or other transparent conductive materials such as carbon nanotubes, nano silver particles, a metal or alloy of which the thickness is smaller than 60 nm, an organic transparent conductive material or other suitable materials.

Figure 3A:
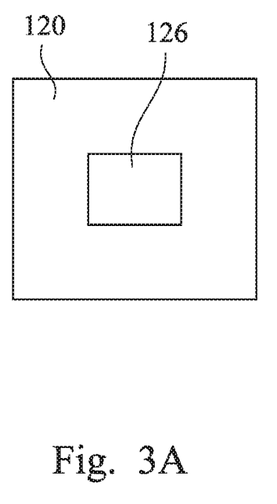
FIG. 3A is a top view of the micro devices according to one embodiment of this disclosure.
Figure 3B:
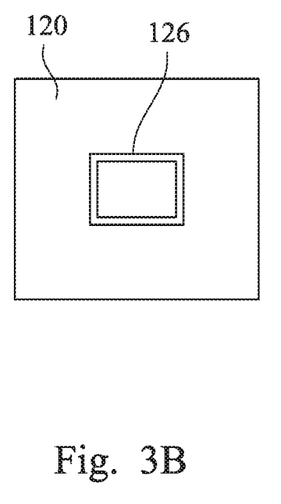
FIG. 3B is a top view of micro devices according to another embodiment of this disclosure.
Figure 3C:
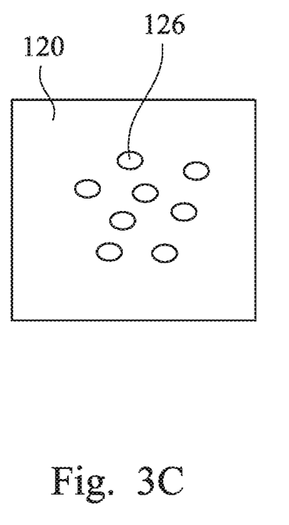
FIG. 3C is a top view of micro devices according to another embodiment of this disclosure.

FIG. 3A is a top view of the micro devices according to one embodiment of this disclosure. FIG. 3B is a top view of the micro devices according to another embodiment of this disclosure. FIG. 3C is a top view of the micro devices according to another embodiment of this disclosure. As shown in FIG. 3A, FIG. 3B and FIG. 3C, the auxiliary electrode 126 may be an entire surface or may be patterned into a local structure. The shape of the patterned auxiliary electrode 126 may be a rectangle, a ring, or ovals as depicted in FIG. 3A, FIG. 3B, and FIG. 3C. When the attraction force is an electrostatic force or a mechanic force, the auxiliary electrode 126 is not needed, which will be described hereinafter. Embodiments of this disclosure are not limited thereto. People having ordinary skill in the art can make proper modifications to the auxiliary electrode 126 depending on the actual applications.

Figure 2B:
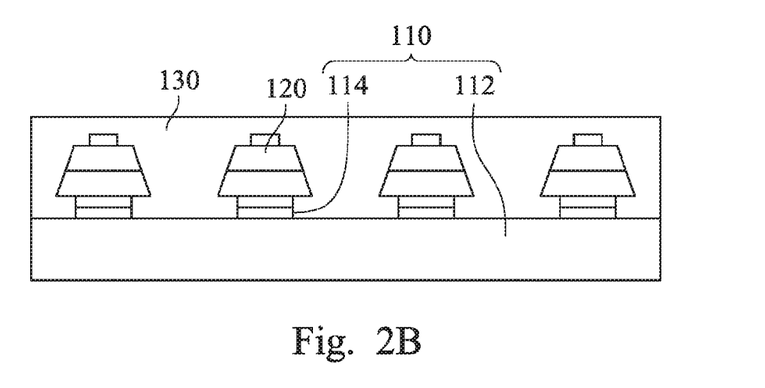

As shown in FIG. 2B, a fixing layer 130 is formed on the carrier substrate 110, and the fixing layer 130 is at least in contact with bottom parts of the micro devices 120. Preferredly, the thickness of the fixing layer 130 is greater than the height of the micro devices 120, such that the fixing layer 130 covers the micro devices 120.

In addition to that, the fixing layer 130 is formed on the body 112. Embodiments of this disclosure are not limited thereto. In other embodiments, the bonding layer 114 may not be patterned, such that the fixing layer 130 is formed on the bonding layer 114.

The fixing layer 130 is formed from a photosensitive organic material including a photoresist material or a photosensitive material. The photoresist material includes positive photoresist and negative photoresist. The fixing layer 130 can be patterned by photolithography. For example, the main material of the fixing layer 130 includes phenol formaldehyde, phenol resin or polyphenylene amide. Embodiments of this disclosure are not limited thereto. People having ordinary skill in the art can make proper modifications to the fixing layer 130 depending on the actual applications.

The thickness of the fixing layer 130 is in a range from about 3 micrometers (μm) to about 20 micrometers (μm). Embodiments of this disclosure are not limited thereto. People having ordinary skill in the art can make proper modifications to the fixing layer 130 depending on the actual applications.

Figure 2C:
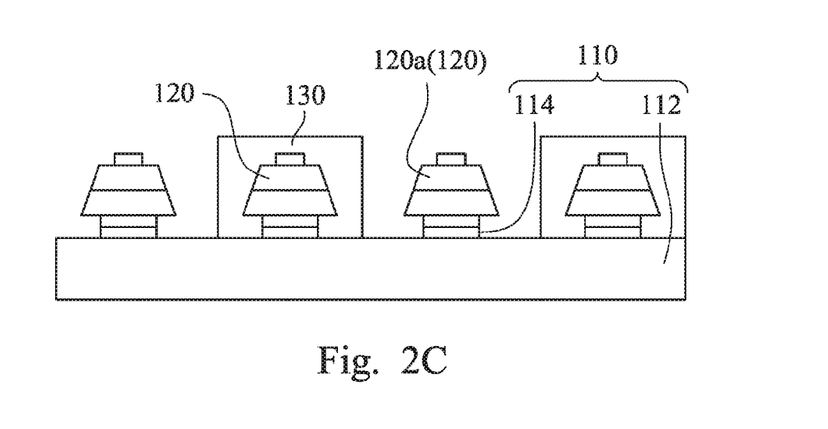

As shown in FIG. 2C, the fixing layer 130 is patterned by photolithography and development to selectively expose at least one of the plurality of the micro devices 120a(120). Further, the patterning of the fixing layer 130 includes the following steps. Firstly, the fixing layer 130 is soft baked, in which the soft bake temperature is in a range from about 80° C. to about 100° C. Then, the fixing layer 130 is developed to selectively expose at least one of the plurality of the micro devices 120a(120). In addition, after the fixing layer 130 is developed, the fixing layer 130 may be hard baked to form the fixing layer 130, in which the hard bake temperature is in a range from about 100° C. to about 120° C.

Figure 2D:
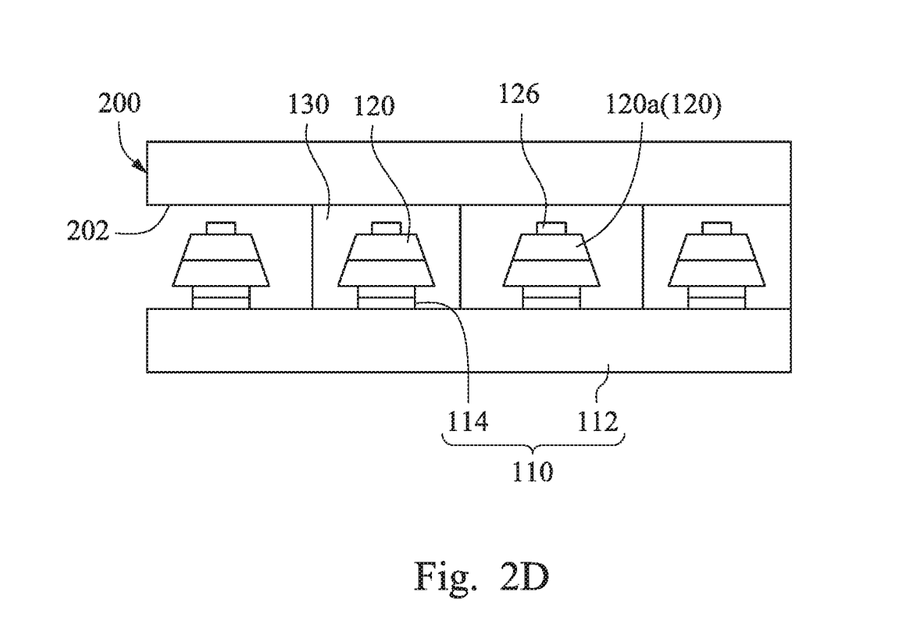
Figure 2E:
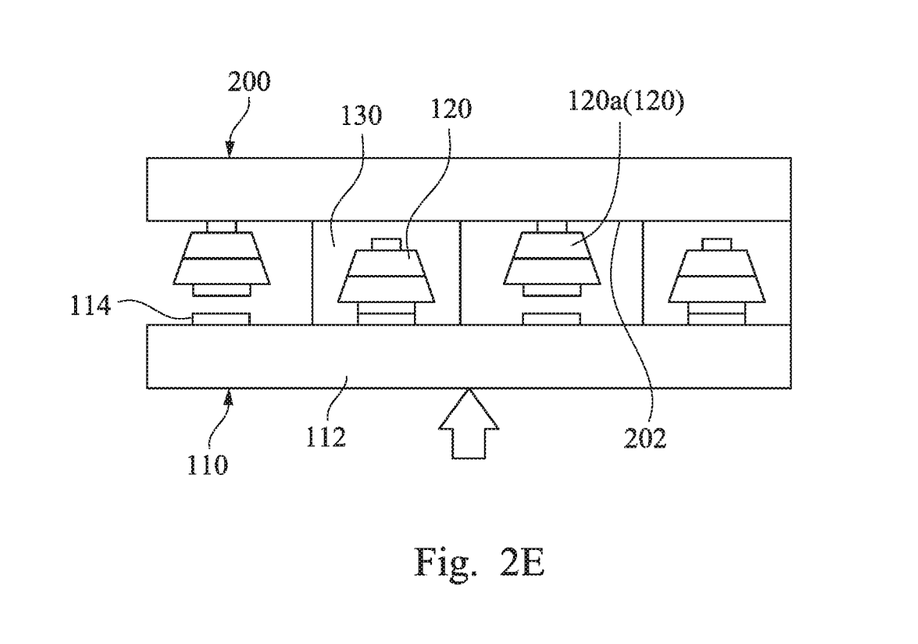

As shown in FIG. 2D, the transfer device 200 is provided and correspondingly located on the carrier substrate 110. Then, the transfer device 200 is disposed on the fixing layer 130. As shown in FIG. 2E, the exposed micro devices 120 are picked up by the transfer device 200.

Then, the transfer device 200 selectively picks up the exposed micro devices 120 by making a pick-up surface 202 of the transfer device 200 in contact with the exposed micro devices 120 (because only a portion of the micro devices 120 are exposed, the micro devices 120 are selectively picked up by the transfer device 200). The exposed micro devices 120 show in FIG. 2C is at least one of the plurality of the micro devices 120a(120). Embodiments of this disclosure are not limited thereto. People having ordinary skill in the art can make proper modifications to the transfer device 200 depending on the actual applications.

In the embodiment, the transfer device 200 picks up the exposed micro devices 120a(120) by using a force at a distance, in which the force may be a magnetic force or an electrostatic force. Embodiments of this disclosure are not limited thereto. In other embodiments, the transfer device 200 may pick up the exposed micro devices 120a(120) by using a contact force. When the force is an electrostatic force, the pick-up surface 202 of the transfer device 200 has a metal layer connected to an external circuit, so as to generate an electrostatic force to pick up the exposed micro devices 120a(120), and the auxiliary electrode 126 is not needed by the micro devices 120. When the force is a magnetic force, the pick-up surface 202 of the transfer device 200 has a conductive magnetic layer connected to an external circuit, so as to generate a magnetic force to pick up the exposed micro devices 120a(120). Specifically, the conductive magnetic layer generates the magnetic force to attract the auxiliary electrode 126 of each of the exposed micro devices 120a(120). Embodiments of this disclosure are not limited thereto. In other embodiments, the pick-up surface 202 of the transfer device 200 may have a soft magnet layer to generate a magnetic force to pick up the exposed micro devices 120 (the magnetic force attracts the auxiliary electrode 126). In addition, the pick-up surface 202 of the transfer device 200 is substantially a planar structure. The pick-up surface 202 of the transfer device 200 doesn't need to fit different sizes of the micro devices 120 for different design. Therefore, the transfer device 200 can be used for different sizes of the micro devices 120, such that the manufacturing cost of the transfer device 200 can be reduced. Moreover, since the pick-up surface 202 of the transfer device 200 is substantially planar or planar, the alignment issue may not become a problem, and the situation that the micro devices 120 may be damaged or may not be electrically connected to the corresponding circuit can be avoided.

Furthermore, before the transfer device 200 picks up the exposed micro devices 120a(120), additional energy is applied to the bonding layer 114, such that the adhesive force of the bonding layer 114 becomes smaller. Therefore, the bonding layer 114 stops fixing the micro devices 120 on the body 112, and the transfer device 200 can pick up the exposed micro devices 120a(120), such that the exposed micro devices 120a(120) is released from the body 112.

The bonding layer 114 may be formed from organic polymer, metal, alloy, or less sticky tape. Additional energy may be applied to the bonding layer 114 by ultraviolet light irradiation, laser irradiation, or heating according the characteristics of the bonding layer 114. For example, the bonding layer 114 is made of tin (Sn), but is not limit thereto. Before the exposed micro devices 120a(120) are separate from the transfer device 200, the bonding layer 114 is heated to be melted. Then, the micro devices 120 are released from the body 112 (a portion of the bonding layer 114 may be released from the body 112 while the micro devices 120 are released from the body 112). Embodiments of this disclosure are not limited thereto. People having ordinary skill in the art can make proper modifications to the material of the bonding layer 114 and the method for inputting energy to the bonding layer 114 depending on the actual applications.

The body 112 may be made of plastic, silicon substrate, or polymer materials. Embodiments of this disclosure are not limited thereto. People having ordinary skill in the art can make proper modifications to the material of the body 112 depending on the actual applications.

Because the micro devices 120 are not fixed on the body 112 by the bonding layer 114 any more, the exposed micro devices 120a(120) can be picked up by the transfer device 200. Because the micro devices 120 covered by the fixing layer 130 are fixed on the body 112 by the fixing layer 130, the micro devices 120 covered by the fixing layer 130 are not picked up by the transfer device 200.

Figure 2F:
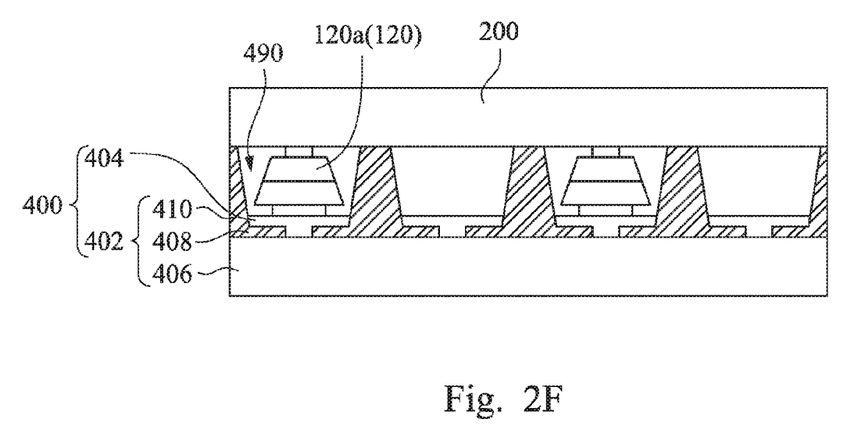

As shown in FIG. 2F, a receiving substrate 400 is provided, and the micro devices 120 are transferred to the receiving substrate 400. The receiving substrate 400 includes a connecting layer 404 and an array substrate 402. The array substrate 402 includes thin film transistors (not shown) used to drive the micro devices 120. The connecting layer 404 is disposed on the array substrate 402, and the micro devices 120 are transferred to the connecting layer 404. The material of the connecting layer 404 includes metal in molten state, conductive adhesive, and adhesive glue. For example, the material of connecting layer 404 is metal in molten state by inputting additional energy to the connecting layer 404. Then, the connecting layer 404 can fix the micro devices on the array substrate 402. The metal in molten state may be at least one of indium (In), bismuth (Bi), tin (Sn), silver (Ag), gold, copper, gallium (Ga), and antimony (Sb). Embodiments of this disclosure are not limited thereto. After the micro devices 120 are transferred to the receiving substrate 400, the connecting layer 404 is heated, such that the connecting layer 404 is melted. Then, the connecting layer 404 can fix the micro devices 120 on the array substrate 402. The method for applying energy to the connecting layer 404 may be ultraviolet light irradiation, laser irradiation, or heating. The adhesive glue can be any adhesive film, such as encapsulating glue, silicone, or photoresist material.

Figure 2G:
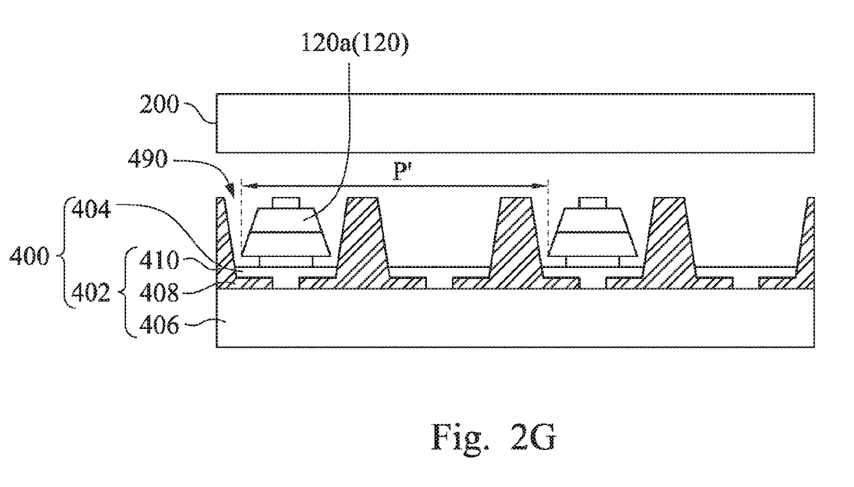

As shown in FIG. 2G, the transfer device 200 is removed, and the force at a distance is removed, such that the micro devices 120 leaves to the receiving substrate 400 and disposed on the receiving substrate 400.

In addition to, the array substrate 402 includes a pixel circuit 406 and an insulating layer 408. The pixel circuit 406 may include at least one thin film transistor (not shown). The insulating layer 408 is disposed on the pixel circuit 406. The connecting layer 404 is electrically connected to the pixel circuit 406. The insulating layer 408 may selectively have protrusions 410, and the protrusions 410 and the connecting layer 404 form containing spaces 490. The containing spaces 490 respectively contain the micro devices 120 transferred to the connecting layer 404. Additionally, the heights of the protrusions 410 and the micro devices 120 transferred to the connecting layer 404 are substantially the same.

As shown in FIG. 2A and FIG. 2G, a pitch P' exists between the micro devices 120 disposed on the receiving substrate 400, and the pitch P' is different from the pitch P existing between the micro devices 120 disposed on the carrier substrate 110. Specifically, the pitch P' is an integer multiple of the pitch P. The integer multiple is preferably greater than two.

Since the processes of forming and patterning the fixing layer 130 are typical processes, no new manufacturing facilities are needed when the aforementioned method is used, such that the manufacturing cost is reduced. In the mean time, since the manufacturing processes are typical, the yield can be improved.

In addition, as shown in FIG. 2D, because the thickness of the fixing layer 130 is greater than the height of the micro devices 120, the micro devices 120 may not be damaged by the direct hit of the transfer device 200, such that the yield can be improved.

Moreover, because only the exposed micro devices 120 can be picked up by the transfer device 200, the alignment issue about the transfer device 200 and the micro devices 120 does not become a problem. Because the micro devices are selectively exposed by patterning the fixing layer 130, and the patterning of the fixing layer 130 has a very high precision, errors do not occur likely.

Furthermore, the micro devices 120 covered by the fixing layer 130 will not be contaminated by the dust particles, so that the micro devices 120 can be used in the subsequent processes, and thus the associated yield is improved.

Figure 4:
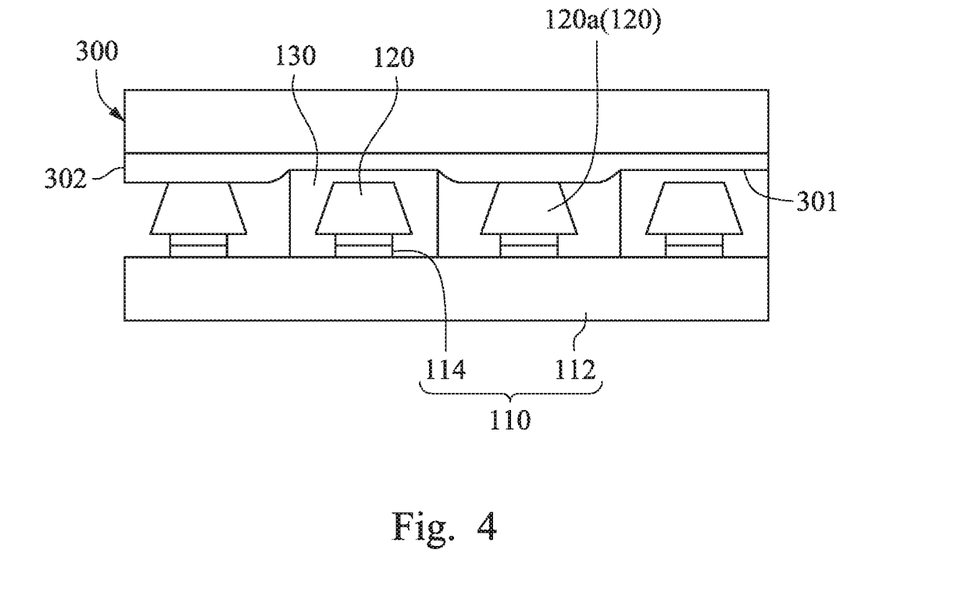
FIG. 4 is a cross-sectional view of one operation in a method for transferring micro devices according to another embodiment of this disclosure.

FIG. 4 is a cross-sectional view of one operation in a method for transferring the micro devices 120 according to another embodiment of this disclosure. The embodiment is similar to the aforementioned embodiment, and the main difference from the aforementioned embodiment is that, in the embodiment, a transfer device 300 picks up the exposed micro devices 120a(120) by a contact force. As shown in FIG. 4, a pick-up surface 301 of the transfer device 300 has an elastic adhesive layer 302, and the transfer device 300 picks up the exposed micro devices 120 by the elastic adhesive layer 302. The thickness of the fixing layer 130 is greater than the height of the micro devices 120. When the transfer device 300 is disposed on the fixing layer 130, a portion of the elastic adhesive layer 302 protrudes from the fixing layer 130, such that the portion of the elastic adhesive layer 302 is in contact with the exposed micro devices 120 and adheres to the micro devices 120. Because the fixing layer 130 is fixed on the body 112 (the fixing layer 130 is disposed on the body 112), the fixing layer 130 will not be picked up when the transfer device 300 adheres and picks up the exposed micro devices 120.

Figure 5:
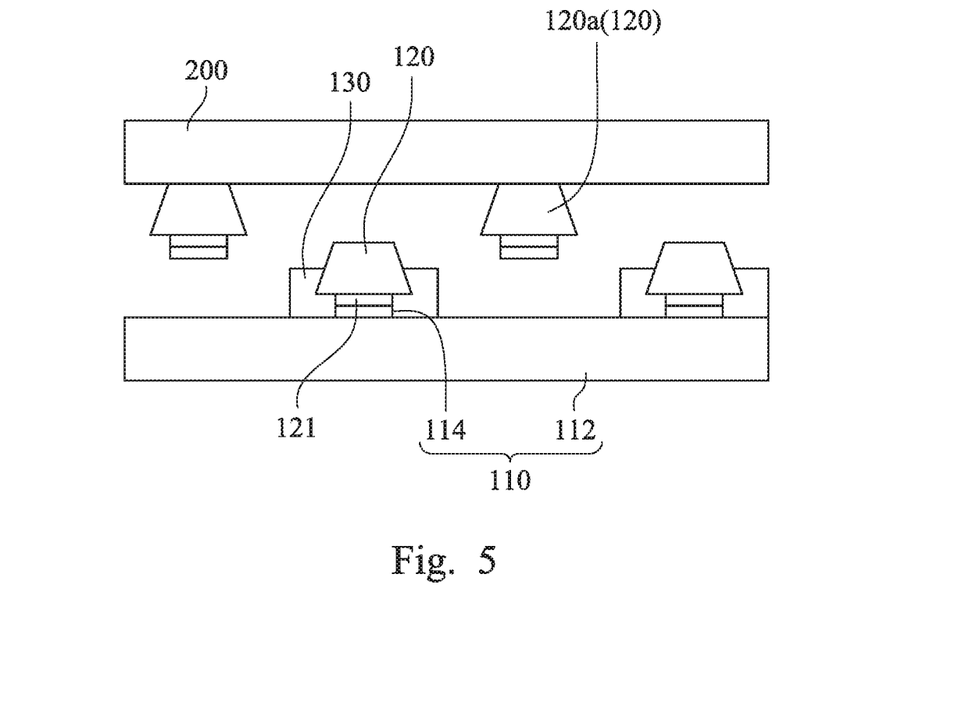
FIG. 5 is a cross-sectional view of one operation in a method for transferring micro devices according to another embodiment of this disclosure.

FIG. 5 is a cross-sectional view of one operation in a method for transferring the micro devices 120 according to another embodiment of this disclosure. The embodiment is similar to the embodiment of FIG. 2A to FIG. 2G, and the main difference from the aforementioned embodiment is that, in the embodiment, the fixing layer 130 only covers bottom parts of the micro devices 120. In other embodiments, the fixing layer 130 only covers bottom parts and side walls of the micro devices 120. In other words, as shown in FIG. 5, the thickness of the fixing layer 130 is smaller then the height of the micro devices 120. Although top portions of all of the micro devices 120 are exposed by the fixing layer 130 in the embodiment, the micro devices 130 partially covered by the fixing layer 130 are fixed on the body 112 (the fixing layer 130 is disposed on the body 112), and thus are not picked up by the transfer device 200.

Figure 6:
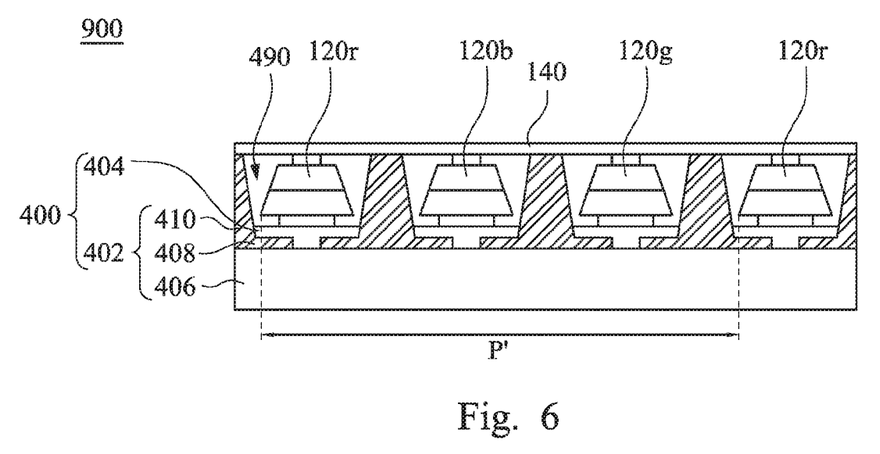
FIG. 6 is a cross-sectional view of a display panel according to one embodiment of this disclosure.

A method for manufacturing a display panel is further provided. As shown in FIG. 1, a first carrier substrate 110r is provided, and first micro LEDs 120r are formed on the first carrier substrate 110r. As shown in FIG. 2A to FIG. 2E, the fixing layer 130 is formed and patterned on the first carrier substrate 110r to selectively expose a portion of the first micro LEDs 120r. Then, the exposed first micro LEDs 120r are picked up by the first transfer device 200 and then transferred to and fixed on the receiving substrate 400. As shown in FIG. 1, a second carrier substrate 110g is provided, second micro LEDs 120g are formed on the second carrier substrate 110g. As shown in FIG. 2A to FIG. 2E, the fixing layer 130 is formed and patterned on the second carrier substrate 110g to selectively expose a portion of the second micro LEDs 120g. Then, the exposed second micro LEDs 120g are picked up by the second transfer device 200' and then transferred to and fixed on the receiving substrate 400. Then, as shown in FIG. 6, a top electrode 140 is formed on the first micro LEDs 120r and the second micro LEDs 120g disposed on the receiving substrate 400, in which the first micro LEDs 120r and the second micro LEDs 120g emit light in different colors. In another embodiment, the first transfer device 200 and the second transfer device 200' may be the same transfer device. Embodiments of this disclosure are not limited thereto. Different numbers of the transfer devices and different numbers of the carrier substrates may be used. People having ordinary skill in the art can make proper modifications to the number of the transfer devices and the number of the carrier substrates depending on the actual applications.

FIG. 6 is a cross-sectional view of a display panel 900 according to one embodiment of this disclosure. As shown in FIG. 6, the display panel 900 includes the receiving substrate 400, the micro devices 120r (i.e., the red micro LEDs), the micro devices 120g (i.e. the green micro LEDs), the micro devices 120b (i.e. the blue micro LEDs), and the top electrode 140. The micro devices 120r, 120g, and 120b are disposed on the receiving substrate 400. The top electrode 140 is disposed on the micro devices 120r, 120g, and 120b, and respectively electrically connected to the micro devices 120r, 120g, and 120b.

In addition to, the receiving substrate 400 includes the connecting layers 404 and the array substrate 402. The connecting layer 404 is disposed on the array substrate 402. The micro devices 120r, 120g, and 120b are disposed on the different parts of connecting layer 404 (the different parts of the connecting layers 404 are not electrically connected to each other). Moreover, the array substrate 402 includes the pixel circuit 406 and the insulating layer 408. The insulating layer 408 is disposed on the pixel circuit 406. The pixel circuit 406 may include at least one thin film transistors (not shown). The connecting layer 404 is electrically connected to the pixel circuit 406. The insulating layer 408 may selectively have protrusions 410, and the protrusions 410 and the connecting layer 404 form accommodation spaces 490. The accommodation spaces 490 respectively accommodate the micro devices 120r, 120g, and 120b transferred on the connecting layer 404. Additionally, the heights of the protrusions 410 and the micro devices 120r, 120g, 120b transferred on the connecting layer 404 are substantially the same, and the top electrode 130 is disposed on the protrusions 410.

The top electrode 140 may be formed from transparent metal oxide, such as at least one of indium tin oxide (ITO), indium zinc oxide (IZO), aluminum zinc oxide (AZO), aluminum indium oxide (AlO), indium oxide (InO), and gallium oxide (GaO) or other transparent conductive materials, such as carbon nanotubes, nano silver particles, a metal or alloy with the thickness less than 60 nm, an organic transparent conductive material or other suitable materials. Embodiments of this disclosure are not limited thereto. People having ordinary skill in the art can make proper modifications to the material of the top electrode 140 depending on the actual applications.

In addition to, when a display panel is formed, micro LEDs with three different colors (i.e., red, green, and blue) are respectively disposed on the receiving substrate. Two different methods for forming a display panel are described below.

Figure 7:
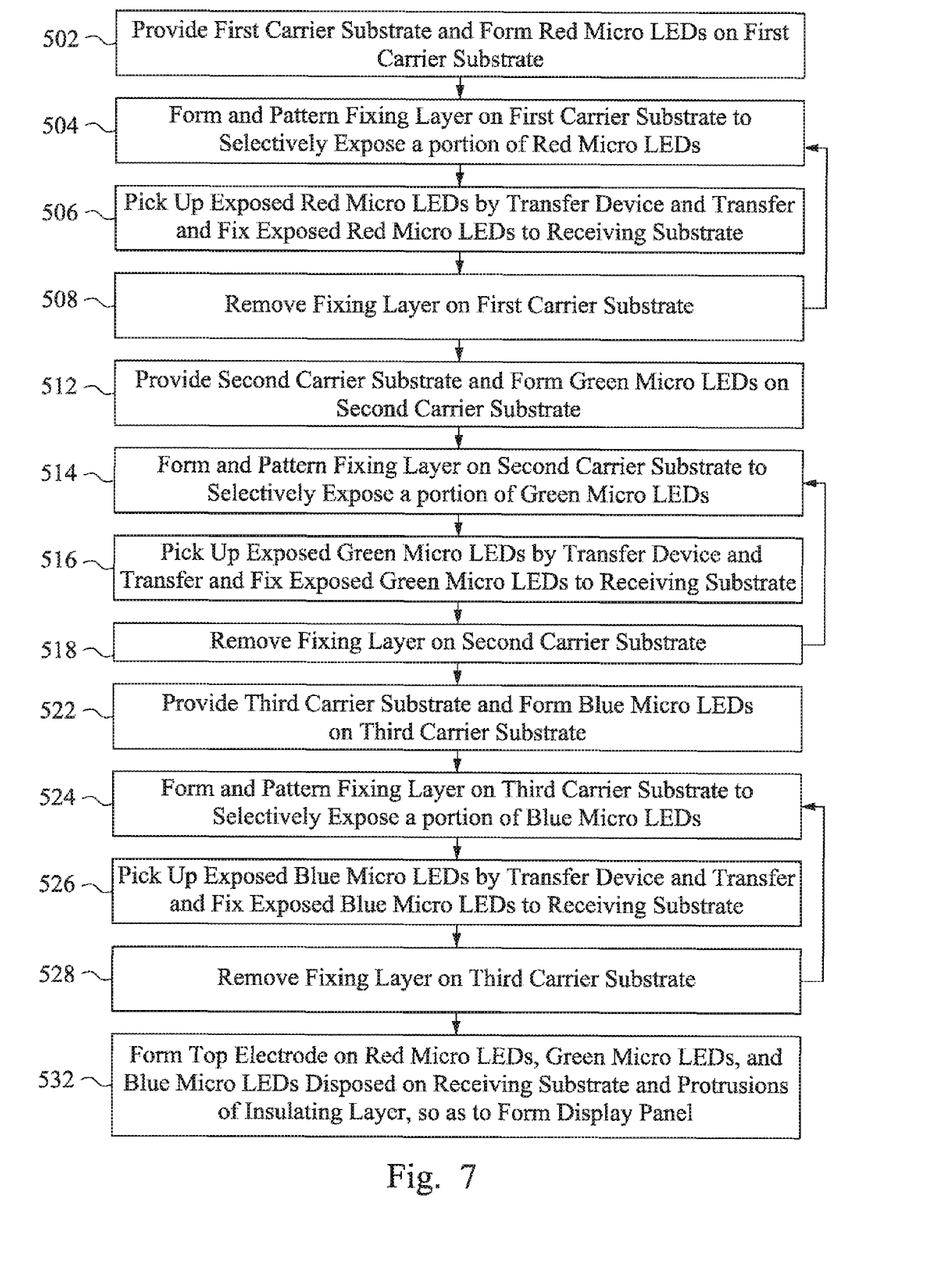
FIG. 7 is a flow chart of a method for forming the display panel according to one embodiment of this disclosure.

FIG. 7 is a flow chart of a method for forming a display panel according to one embodiment of this disclosure. In the embodiment, the fixing layer is hard baked, and thus the fixing layer can only be used once. As shown in FIG. 7, operation 502 is performed to provide a first carrier substrate and to form micro LEDs on the first carrier substrate. Operation 502 may correspond to FIG. 2A.

Operation 504 is performed to form and pattern a fixing layer on the first carrier substrate to selectively expose a portion of the red micro LEDs. Operation 504 may correspond to FIG. 2B and FIG. 2C.

At first, the fixing layer is coated on the first carrier substrate, in which the fixing layer is at least in contact with bottom parts of the red micro LEDs. Then, the fixing layer is soft baked (the temperature is about 80° C. to about 100° C.). Then, the fixing layer is exposed and developed to selectively expose a portion of the red micro LEDs. Finally, the fixing layer is hard baked to cure the fixing layer. Operation 504 should be performed in the yellow lighting environment, such that the fixing layer may not be affected by the lighting. In the embodiment, the fixing layer is hard baked, and thus the fixing layer can only be used once. After the fixing layer disposed on the first carrier substrate is removed in operation 508, operation 504 should be performed repeatedly to form and pattern the fixing layer on the first carrier substrate. Only after all of the red micro LEDs are transferred, which is performed in operation 506, operation 512 is performed. Similarly, while green micro LEDs are formed, operations 514 and 518 are repeatedly performed, and then operation 522 is performed. Similarly, while blue micro LEDs are formed, operations 524 and 528 are repeatedly performed, and then operation 522 is performed.

Operation 506 is performed to pick up the exposed red micro LEDs by the transfer device and transfer and fix the exposed red micro LEDs to the receiving substrate. Operation 506 may correspond to FIG. 2D, FIG. 2E, FIG. 2F, and FIG. 2G.

Operation 508 is performed to remove the fixing layer on the first carrier substrate. At the same time, the red micro LEDs which are not transferred by the transfer device are still disposed on the first carrier substrate.

Operation 512 is performed to provide a second carrier substrate and to form green micro LEDs on the second carrier substrate. Operation 512 may correspond to FIG. 2A.

Operation 514 is performed to form and pattern a fixing layer on the second carrier substrate to selectively expose a portion of the green micro LEDs. Operation 514 may correspond to FIG. 2B and FIG. 2C.

Moreover, the fixing layer is formed on the second carrier substrate, in which the fixing layer is at least in contact with bottom parts of the green micro LEDs. Then, the fixing layer is soft baked. Then, the fixing layer is exposed and developed to selectively expose a portion of the green micro LEDs. Finally, the fixing layer is hard baked to cure the fixing layer. Operation 514 should be performed in the yellow lighting environment.

Operation 516 is performed to pick up the exposed green micro LEDs by the transfer device and transfer and fix the exposed green micro LEDs to the receiving substrate. Operation 516 may correspond to FIG. 2D, FIG. 2E, FIG. 2F, and FIG. 2G.

When the green micro LEDs are transferred, the fixing layer is cured. Therefore, operation 516 does not need to be performed in the yellow lighting environment.

Operation 518 is performed to remove the fixing layer on the second carrier substrate. At the same time, the green micro LEDs which are not transferred by the transfer device are still disposed on the second carrier substrate.

Operation 522 is performed to provide a third carrier substrate and to form blue micro LEDs on the third carrier substrate. Operation 522 may correspond to FIG. 2A.

Operation 524 is performed to form and pattern a fixing layer on the third carrier substrate to selectively expose a portion of the blue micro LEDs. Operation 524 may correspond to FIG. 2B and FIG. 2C.

Specifically, the fixing layer is formed on the third carrier substrate, in which the fixing layer is at least in contact with bottom parts of the blue micro LEDs. Then, the fixing layer is soft baked. Then, the fixing layer is exposed and developed to selectively expose a part of the blue micro LEDs. Finally, the fixing layer is hard baked to cure the fixing layer. Operation 524 should be performed in the yellow lighting environment.

Operation 526 is performed to pick up the exposed blue micro LEDs by the transfer device and transfer and fix the exposed blue micro LEDs to the receiving substrate. Operation 526 may correspond to FIG. 2D, FIG. 2E, FIG. 2F, and FIG. 2G.

Operation 528 is performed to remove the fixing layer on the third carrier substrate. At the same time, the blue micro LEDs which are not transferred by the transfer device are still disposed on the third carrier substrate.

Operation 532 is performed to form a top electrode on the red micro LEDs, the green micro LEDs, and the blue micro LEDs disposed on the receiving substrate and the protrusions of the insulating layer, so as to form a display panel (see FIG. 6).

Figure 8:
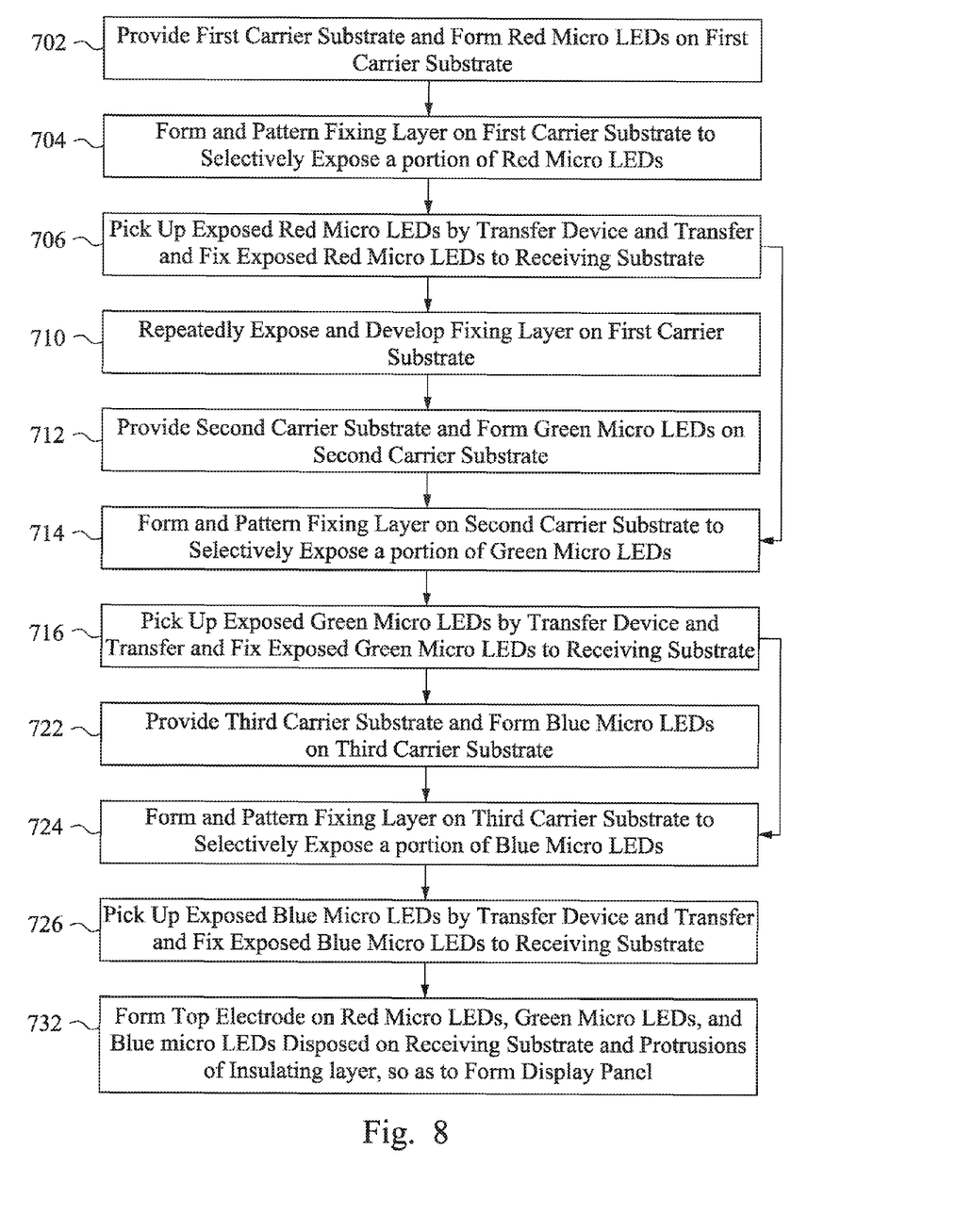
FIG. 8 is a flow chart of a method for forming a display panel according to another embodiment of this disclosure.

FIG. 8 is a flow chart of a method for forming a display panel according to another embodiment of this disclosure. As shown in FIG. 8, operation 702 is performed to provide a first carrier substrate and form red micro LEDs on the first carrier substrate. Operation 502 may correspond to FIG. 2A.

Operation 704 is performed to form and pattern a fixing layer on the first carrier substrate to selectively expose a portion of the red micro LEDs. Operation 704 may correspond to FIG. 2B and FIG. 2C.

Specifically, at first, the fixing layer is formed on the first carrier substrate, in which the fixing layer is at least in contact with bottom parts of the red micro LEDs. Then, the fixing layer is soft baked. Then, the fixing layer is exposed and developed to selectively expose a part of the red micro LEDs. Operation 704 should be performed in the yellow lighting environment.

Operation 706 is performed to pick up the exposed red micro LEDs by the transfer device and transfer and fix the exposed red micro LEDs to the receiving substrate. Operation 706 may correspond to FIG. 2D, FIG. 2E, FIG. 2F, and FIG. 2G.

When the red micro LEDs are transferred, the fixing layer is not cured. Therefore, operation 706 should be performed in the yellow lighting environment, such that the fixing layer may not be affected by the lighting. In addition, at the same time, the red micro LEDs which are not transferred by the transfer device are still disposed on the first carrier substrate. Operation 710 are repeatedly performed to expose and develop the fixing layer on the first carrier substrate. Compared to the embodiment of FIG. 7, because the fixing layer does not to be removed and can be repeatedly used, the manufacturing cost can be reduced, and process sites can be minimized, such that process time can be reduced. When the green micro LEDs and the blue micro LEDs are transferred in the subsequent processes, operations similar to operation 710 may also be performed.

Operation 712 is performed to provide a second carrier substrate and form green micro LEDs on the second carrier substrate. Operation 712 may correspond to FIG. 2A.

Operation 714 is performed to form and pattern a fixing layer on the second carrier substrate to selectively expose a portion of the green micro LEDs. Operation 714 may correspond to FIG. 2B and FIG. 2C.

Specifically, at first, the fixing layer is formed on the second carrier substrate, in which the fixing layer is at least in contact with bottom parts of the green micro LEDs. Then, the fixing layer is soft baked. Then, the fixing layer is exposed and developed to selectively expose a portion of the green micro LEDs.

Operation 716 is performed to pick up the exposed green micro LEDs by the transfer device and transfer and fix the exposed green micro LEDs to the receiving substrate. Operation 716 may correspond to FIG. 2D, FIG. 2E, FIG. 2F, and FIG. 2G.

When the green micro LEDs are transferred, the fixing layer are not cured. Therefore, operation 716 should be performed in the yellow lighting environment. In addition, at the same time, the green micro LEDs which are not transferred by the green micro LEDs are still disposed on the second carrier substrate.

Operation 722 is performed to provide a third carrier substrate and form blue micro LEDs on the third carrier substrate. Operation 722 may correspond to FIG. 2A.

Operation 724 is performed to form and pattern a fixing layer on the third carrier substrate to selectively expose a portion of the blue micro LEDs. Operation 724 may correspond to FIG. 2B and FIG. 2C.

Specifically, at first, the fixing layer is formed on the third carrier substrate, in which the fixing layer is at least in contact with bottom parts of the blue micro LEDs. Then, the fixing layer is soft baked. Then, the fixing layer is exposed and developed to selectively expose a portion of the blue micro LEDs. Operation 724 should be performed in the yellow lighting environment.

Operation 726 is performed to pick up the exposed blue micro LEDs by the transfer device and transfer and fix the exposed blue micro LEDs to the receiving substrate. Operation 726 may correspond to FIG. 2D, FIG. 2E, FIG. 2F, and FIG. 2G.

When the blue micro LEDs are transferred, the fixing layer are not cured. Therefore, operation 726 should be performed in the yellow lighting environment. In addition, at the same time, the blue micro LEDs which are not transferred by the blue micro LEDs are still disposed on the third carrier substrate.

Operation 732 is performed to form a top electrode on the red micro LEDs, the green micro LEDs, and the blue micro LEDs disposed on the receiving substrate and the protrusions of the insulating layer, so as to form a display panel (see FIG. 6).

As shown in FIG. 7 and FIG. 8, between the two flow charts of forming a display panel, the main difference is that, in operations 504, 514, and 524, the fixing layer is hard baked to cure the fixing layer, and in operations 704, 714, and 724, the fixing layer is not hard baked, such that the fixing layer is not cured. Therefore, operations 506, 516, and 526 do not need to be performed in the yellow lighting environment. Embodiments of this disclosure are not limited thereto. In addition, in the forming method shown in FIG. 7, once the micro LEDs are transferred, the fixing layer on the carrier substrate is removed (in operations 508, 518 and 528). In the forming method of FIG. 8, after the micro LEDs are transferred, the fixing layer can be repeatedly used, such that cost and time are reduced.

Embodiments of this disclosure are not limited thereto. People having ordinary skill in the art can make proper modifications to the order of transferring the red micro LEDs, the green micro LEDs, and the blue micro LEDs depending on the actual application.

As shown in FIG. 2E, after the exposed micro devices 120a(120) are transferred by the transfer device 200, the other micro devices which are not transferred can be transferred to another receiving substrate in the subsequent processes. The processes for transferring the micro devices 120 which are not transferred can be performed by patterning the fixing layer again to expose at least a portion of the other micro devices 120, and then transferring the micro devices 120 to another receiving substrate by the method similar to the aforementioned processes. Alternatively, the fixing layer 130 can be removed first, and then a new fixing layer is formed and patterned to expose at least one portion of the other micro devices. Then, the micro devices 120 are transferred to another receiving substrate by the method similar to the aforementioned processes. Operations for transferring the micro devices 120 to another receiving substrate may be preformed repeatedly. In other words, after the exposed micro devices 120 are transferred by the transfer device 200, the other micro devices 120 which are not transferred can be transferred to a plurality of other receiving substrates by repeatedly patterning fixing layer 130 and transferring the exposed micro devices 120. Alternatively, the other micro devices 120 which are not transferred can be transferred to a plurality of other receiving substrates by repeatedly removing the fixing layer 130, forming and patterning the new fixing layer 130, and transferring the exposed micro devices 120.

When FIG. 7 is referred to describe the aforementioned processes, operation 532 is first performed, and then operations 504, 506, 508, 514, 516, 518, 524, 526, 528, 532 are sequentially performed to form another display panel.

When FIG. 8 is referred to describe the aforementioned processes, operation 732 is first performed, and then operations 704, 706, 714, 716, 724, 726, and 732 are sequentially performed to form another display panel. Because the fixing layers on the first carrier substrate, the second carrier substrate, and the third substrate are not removed, no new fixing layers are formed on the first carrier substrate, the second carrier substrate, and the third carrier substrate when operations 704, 714, and 724 are performed. In other words, fixing layers on the first carrier substrate, the second carrier substrate, and the third carrier substrate are repeatedly can used for manufacturing different display panels.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A method for transferring micro devices, the method comprising:
   providing a carrier substrate, and forming a plurality of micro devices on the carrier substrate;
   forming a fixing layer on the carrier substrate, wherein the fixing layer is at least in contact with bottom parts of the micro devices;
   patterning the fixing layer to selectively expose at least one of the plurality of micro devices;
   providing a transfer device correspondingly located on the carrier substrate, and picking up the at least one of the plurality of micro devices by the transfer device; and
   providing a receiving substrate and transferring the at least one of the plurality of micro devices to the receiving substrate.

2. The method of claim 1, wherein the fixing layer is formed from a photosensitive organic material.

3. The method of claim 1, wherein a pick-up surface of the transfer device in contact with the at least one of the plurality of micro devices is provided.

4. The method of claim 3, wherein the transfer device picks up the at least one of the plurality of micro devices by using a force at a distance.

5. The method of claim 4, wherein the pick-up surface of the transfer device has a metal layer connected to an external circuit, thereby generating an electrostatic force on the metal layer to pick up the at least one of the plurality of micro devices.

6. The method of claim 4, wherein the pick-up surface of the transfer device has a conductive magnetic layer connected to an external circuit, thereby generating a magnetic force on the conductive magnetic layer to pick up the at least one of the plurality of micro devices.

7. The method of claim 3, wherein the pick-up surface of the transfer device has an elastic adhesive layer, and the transfer device picks up the at least one of the plurality of micro devices by using the elastic adhesive layer.

8. The method of claim 1, wherein, when the plurality of micro devices are disposed on the carrier substrate, a first pitch exists between adjacent two of the micro devices, and a second pitch exists between adjacent two of the micro devices disposed on the receiving substrate after the transfer device transfers from the at least one of the plurality of micro devices to the receiving substrate, wherein the second pitch is an integer multiple of the first pitch.

9. The method of claim 1, further comprising:
   patterning the fixing layer again to selectively expose another portion of the plurality of micro devices;
   picking up the another portion of the plurality of micro devices by using the transfer device;
   transferring the another portion of the plurality of micro device to another receiving substrate; and
   repeating the operation of patterning the fixing layer and the operation of transferring the exposed micro devices to other receiving substrates.

10. The method of claim 1, wherein the carrier substrate further comprises a bonding layer and a body, the bonding layer temporarily fixes the plurality of micro devices on the body.

11. The method of claim 10, wherein the bonding layer is formed from organic polymer, metal, alloy, or less sticky tape.

12. The method of claim 10, wherein before the operation of picking up the at least one the plurality of micro devices by the transfer device, the bonding layer is irradiated by ultraviolet light or laser, or the bonding layer is heated, thereby releasing the bonding layer from the body.

13. The method of claim 1, wherein the receiving substrate includes a connecting layer and an array substrate, and after the at least one of the plurality of micro devices are transferred, the connecting layer fixes the at least one of the plurality of micro devices on the array substrate.

14. The method of claim 13, wherein a material of the connecting layer includes metal in molten state, conductive adhesive, or adhesive glue.

15. A method for manufacturing a display panel, the method comprising:
   providing a first carrier substrate, and forming a plurality of first micro devices on the first carrier substrate;
   forming and patterning a fixing layer on the first carrier substrate to selectively expose at least one of the plurality of first micro devices;
   picking up the at least one of the plurality of the first micro devices by the first transfer device, and transferring and fixing the at least one of the plurality of first micro devices on the receiving substrate;
   providing a second carrier substrate, and forming a plurality of second micro devices on the second carrier substrate;
   forming and patterning another fixing layer on the second carrier substrate to selectively expose at least one of the plurality of second micro devices;
   picking up the at least one of the plurality of second micro devices by a second transfer device, and transferring and fixing the at least one of the plurality of second micro devices on the receiving substrate; and
   forming a top electrode on the at least one of the plurality of first micro devices and the at least one of the plurality of second micro devices disposed on the receiving substrate, wherein the first micro devices and the second micro devices emit light in different colors.

16. The method of claim 15, wherein the plurality of first micro devices have a first pitch existing between adjacent two of the plurality of first micro devices on the first carrier substrate, and after the plurality of first micro devices are transferred to the receiving substrate, the plurality of first micro devices have a second pitch existing between adjacent two of the plurality of first micro devices on the receiving substrate, wherein the second pitch is an integer multiple of the first pitch and the plurality of first micro devices emit light in a same color.

17. The method of claim 15, wherein the plurality of second micro devices have a first pitch existing between adjacent two of the plurality of second micro devices on the second carrier substrate, and after the plurality of second micro devices are transferred to the receiving substrate, the plurality of second micro devices have a second pitch existing between adjacent two of the plurality of second micro devices on the receiving substrate, wherein the second pitch is an integer multiple of the first pitch and the plurality of second micro devices emit light in a same color.

18. The method of claim 15, wherein the receiving substrate includes a connecting layer and an array substrate, and after at least one of the plurality of first micro devices and at least one of the plurality of second micro devices are transferred to the receiving substrate, the connecting layer fixes the at least one of the plurality of first devices and the at least one of the plurality of second micro devices on the array substrate.

19. The method of claim 18, wherein a material of the connecting layer includes metal in molten state, conductive adhesive, or adhesive glue.

\* \* \* \* \*